United States Patent [19]
Yoo et al.

[11] Patent Number: 5,866,451
[45] Date of Patent: Feb. 2, 1999

[54] METHOD OF MAKING A SEMICONDUCTOR DEVICE HAVING 4T SRAM AND MIXED-MODE CAPACITOR IN LOGIC

[75] Inventors: Chue-San Yoo; Mong-Song Liang; Jin-Yuan Lee, all of Hsin-Chu, Taiwan

[73] Assignee: Taiwan Semiconductor Manufacturing Company Ltd, Hsin-Chu, Taiwan

[21] Appl. No.: 654,498

[22] Filed: May 28, 1996

[51] Int. Cl.$^6$ ............................................. H01L 21/8242
[52] U.S. Cl. .......................... 438/241; 438/238; 438/233; 438/210; 438/200
[58] Field of Search .................................. 438/152, 155, 438/200, 210, 233, 238, 241

[56] References Cited

U.S. PATENT DOCUMENTS

| | | | |
|---|---|---|---|
| 5,066,602 | 11/1991 | Takemoto et al. | 437/31 |
| 5,340,762 | 8/1994 | Vora | 437/52 |
| 5,719,079 | 1/1998 | Yoo et al. | 438/238 |

OTHER PUBLICATIONS

S. Wolf, "Silicon Processing For The VLSI Era–vol. 2" Lattice Press, Sunset Beach, CA, p. 571–572.

*Primary Examiner*—Charles L. Bowers, Jr.
*Assistant Examiner*—Toniae M. Thomas
*Attorney, Agent, or Firm*—George O. Saile; Stephen B. Ackerman

[57] ABSTRACT

An integrated process for forming a 4T SRAM and a mixed-mode capacitor, with logic, on the same integrated circuit, is provided. A semiconductor substrate is provided having field isolation regions, with a gate and gate oxide between the field isolation regions. Polysilicon interconnects are formed over a portion of the field isolation regions, only in a first memory region, and a bottom capacitor plate over a field oxide region in a capacitor region. Active regions are formed in the substrate, adjacent to each gate. Insulating spacers are formed on the sidewalls of the gates, polysilicon interconnects and the floating gate, and later removed from the interconnect. A layer of titanium silicide is formed over the gates and capacitor bottom plate, and also over the polysilicon interconnects and active regions. An interpoly oxide is formed over the semiconductor substrate. An opening is formed in the interpoly oxide over the polysilicon interconnect. A second layer of polysilicon is deposited over the substrate. The second layer of polysilicon is patterned to form a top capacitor plate, and to form a load resistor for the SRAM.

15 Claims, 4 Drawing Sheets

FIG. 1 – Prior Art

METHOD OF MAKING A SEMICONDUCTOR DEVICE HAVING 4T SRAM AND MIXED-MODE CAPACITOR IN LOGIC

RELATED PATENT APPLICATIONS

U.S. patent application Ser. No. 08/641,767 filed May 2, 1996, "Blending Integrated Circuit Technology", assigned to a common assignee.

U.S. patent application Ser. No. 08/654,131 filed May 28, 1996, "Method of Making a Semiconductor Device having 4T SRAM and Floating Gate Memory", assigned to a common assignee.

U.S. patent application Ser. No. 08/654,467 filed May 28, 1996, "Method of Making a Semiconductor Device having High Density SRAM in Logic with Salicide Process", assigned to a common assignee.

BACKGROUND OF THE INVENTION (1) Field of the Invention

This invention relates to semiconductor manufacturing, and more particularly to an integrated process for forming a four-transistor SRAM (Static Random Access Memory) and mixed-mode capacitors with logic on the same integrated circuit (IC).

(2) Description of the Related Art

Two of the major classifications of devices manufactured by the semiconductor industry are logic and memory. Logic devices are used primarily to process information, while memory devices are used for information storage. Traditionally, while these two device types are found in virtually all electronic systems, such as computers and the like, they have been manufactured on separate integrated circuits and connected only at the card or board level. This has been due to differences in manufacturing processes, cost considerations, economies of scale, and other difficulties in fabricating the different device structures on the same substrate.

However, trends in the semiconductor industry are driving toward making it both desirable and feasible to blend memories and logic on the same integrated circuit (IC). Cost and performance are two of the factors contributing to these trends. While significant economies of scale can be realized by the separate batch processing of large numbers of semiconductor wafers for the two types of device, due to the different process steps needed to produce them, cost savings may also be realized by forming logic and memories on the same integrated circuit. For example, due to the decreased amount of chip area required for a blended logic/memory IC, as compared to the area needed on separate IC's, the product yield can be increased, saving manufacturing cost.

Performance enhancements may also make blending logic and memories on the same IC attractive for particular applications. In electronic systems in which logic and memory are packaged separately, data signals between the two may have to pass through several levels of packaging, i.e., through the originating IC chip to external pins, then through card and/or board wiring, and finally into the receiving IC including its internal wiring, all of which cause undesirable propagation delays. As device densities have increased and device sizes have decreased, transistor switching speeds no longer limit the logic delay or access time of the IC. Rather, the time for the device to charge capacitive loads is the limiting factor for IC performance. The capacitive load is partially dependent on the length of lines interconnecting devices, and so minimizing these connection lengths, as through combining logic and memory on the same IC, will enhance performance.

The applications for blending memory and logic on the same IC are varied, and increasing. See "Silicon Processing for the VLSI Era", Volume 2, Process Integration, S. Wolf, pp. 571–572. Some applications add special logic circuits to memory designs, while others add memory structures to primarily logic IC's.

One example of blending technologies is the formation of both bipolar and CMOS device structures on the same chip, for example as disclosed in U.S. Pat. No. 5,066,602 (Takemoto) and U.S. Pat. No. 5,340,762 (Vora), but the process technology to simultaneously form MOS logic and memories is not discussed.

An example of the addition of memory structures to logic IC's is the Intel 80486 microprocessor, which in addition to the main processor logic has an embedded SRAM (Static Random Access Memory) used as a first-level cache.

It may also be desirable to integrate mixed-mode capacitors with logic and memory on the same IC. Capacitors are a basic building block of many electronic circuits, and may be used for analog application s such as switched capacitor filters, or for digital applications such as the storage node for a DRAM (Dynamic Random Access Memory)

the ability to build capacitors suitable for either digital or analog circuits is referred to as mixed-mode.

One popular process sequence for logic devices is the salicide (self-aligned silicide) process, which is used in forming FET transistors, and which provides self-aligned, low-resistance source/drain contacts. After the gate oxide and polysilicon gate are formed, and after source/drain ion implantation, a layer of reactive metal such as titanium, cobalt or the like is deposited and annealed. The metal reacts with the silicon to form a silicide, such as $TiSi_2$ (titanium silicide), over the source and drain regions, providing a lower resistance contact than that of the diffused junction alone, which is especially valuable as IC feature sizes have been reduced below 1 micrometer.

A Static RAM, or SRAM, of the prior art is shown in FIG. 1. Depicted is one memory cell of a poly-load, or 4T (four transistor), SRAM in which load devices R1 and R2 are high resistance-value resistors. Access transistors N3 and N4 are NMOS devices whose states are controlled by wordline WL, and when conducting connect the bit lines BL1 and BL2 to the main storage element, the flip-flop circuit of NMOS devices N1 and N2.

Buried contacts are used at nodes Q1 and Q2 to connect the doped polysilicon gate electrodes of devices N1 and N2 to the source/drains of access transistors N3 and N4—this connection is commonly referred to as a local interconnect.

SUMMARY OF THE INVENTION

It is therefore an object of the invention to provide an integrated process for forming a 4T SRAM logic and a mixed-mode capacitor with logic on the same integrated circuit.

It is a further object of the invention to provide an integrated process for forming a 4T SRAM, mixed-mode capacitor and logic using the salicide process, on the same integrated circuit (IC), where the logic salicide and SRAM local interconnect are formed simultaneously.

It is a still further object of the invention to provide a process for forming a 4T SRAM, mixed-mode capacitor and logic on the same substrate in which gate-to-source/drain contacts are butted contacts having reduced contact resistance.

These objects are achieved by a method of forming an SRAM, a mixed-mode capacitor, and logic on a single semiconductor substrate, in a first memory region, a capacitor region, and a logic region, respectively. A semiconductor substrate is provided. Field isolation regions are formed in the semiconductor substrate. A gate oxide is formed over the substrate between the field isolation regions. A first polysilicon layer is deposited over the gate oxide, and is patterned to form gates over a portion of the gate oxide, polysilicon interconnects over the a portion of the field isolation regions, only in the first memory region, and a bottom capacitor plate over a field oxide region in the capacitor region. Lightly doped drain (LDD) active regions are formed in the substrate, adjacent to each gate. Insulating spacers are formed on the sidewalls of the gates, polysilicon interconnects and the bottom capacitor plate. Formation of the active regions is completed by a heavy ion implant. The insulating spacers are removed from the sidewalls of the polysilicon interconnects. A layer of titanium silicide is formed over the gates, polysilicon interconnects, bottom capacitor plate and active regions whereby the titanium silicide electrically connects the polysilicon interconnects and the active regions in the first memory region. An interpoly oxide layer is formed over the semiconductor substrate. An opening is formed in the second interpoly oxide over the polysilicon interconnect. A second layer of polysilicon is deposited over the substrate. The second layer of polysilicon is patterned to form a top capacitor plate for the mixed-mode capacitor, and to form a load resistor for the SRAM.

DESCRIPTION OF THE PREFERRED EMBODIMENTS

Figure 2:
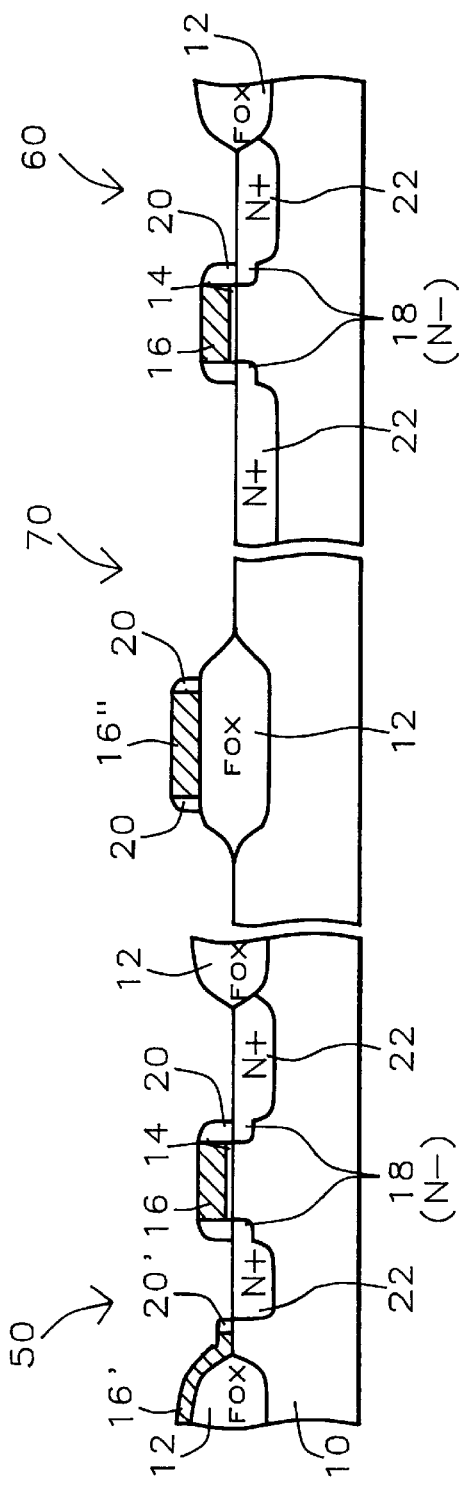
FIG. 2 to 7 are cross-sectional representations of the method of the invention for simultaneously forming a 4-transistor SRAM, mixed-mode capacitor and logic on the same IC.

Referring now to FIGS. 2–7, the method of the invention is described. With reference to FIG. 2, a semiconductor substrate 10 is provided on which it is desired to form, simultaneously, a Static RAM, a mixed-mode capacitor, and logic circuits. A portion of the SRAM 50, a typical logic MOS device 60 and mixed-mode capacitor 70 are shown. Formation of the structures depicted in FIG. 2 is by processes well known in the art and so will be only briefly described. Field isolation regions 12 are formed, to electrically isolate active device regions on the substrate from one another, by, for instance, the LOCOS (LOCal Oxidation of Silicon) process to a thickness of between about 2000 and 5000 Angstroms. Gate oxide 14 is grown thermally and has a thickness of between about 50 and 120 Angstroms.

A first layer of polycrystalline silicon (polysilicon) is now deposited to a thickness of between about 2000 and 3500 Angstroms and is doped by $POCL_3$ or by insitu poly growth. The polysilicon is patterned by conventional lithography and etching to form gate electrodes 16, polysilicon interconnects 16', and a bottom plate 16" for the mixed-mode capacitor. A first source/drain implant is then performed, which for an NMOS device would be phosphorus P31 at a dosage of between about 1 E 13 and 8 E 13 atoms/cm.$^2$ and at an energy of between about 30 and 80 KeV. This implant ultimately results in LDD regions 18 in FIG. 2.

Sidewall spacers 20 and 20' are now formed adjacent to the polysilicon structures, by depositing an insulating material such as $SiO_2$ (silicon oxide) and performing an anisotropic etch to remove the oxide in all but the sidewall regions, as is known in the art. The spacers have a thickness of between about 1000 and 2500 Angstroms.

A heavily doped ion implant is now performed to complete the source/drain regions of the SRAM 50 and logic device 60, where the existing structures—the sidewall spacers, gate and polysilicon interconnects—are used as an implant mask. To illustrate again with the example of an NMOS device, an N+ implant using phosphorus P31 is performed at a dosage of between about 1 E 15 and 8 E 15 atoms/cm.$^2$ and at an energy of between about 30 and 80 KeV. After annealing, this heavy implant results in regions 22 of the memory and logic devices.

Figure 1:
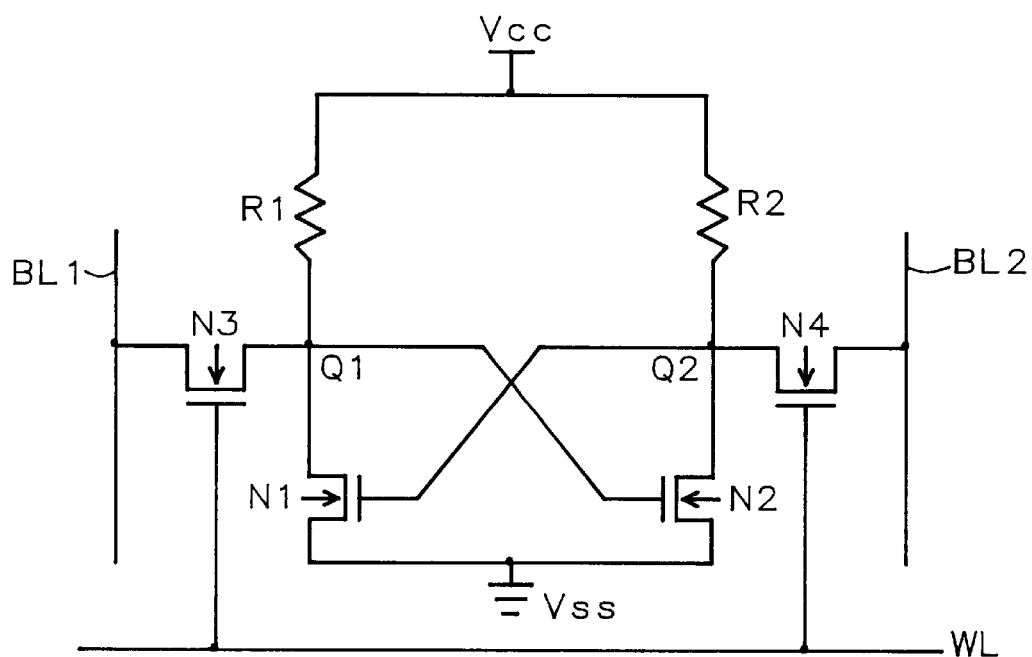
FIG. 1 is a schematic circuit diagram of a poly-load SRAM of the prior art.
Figure 3:
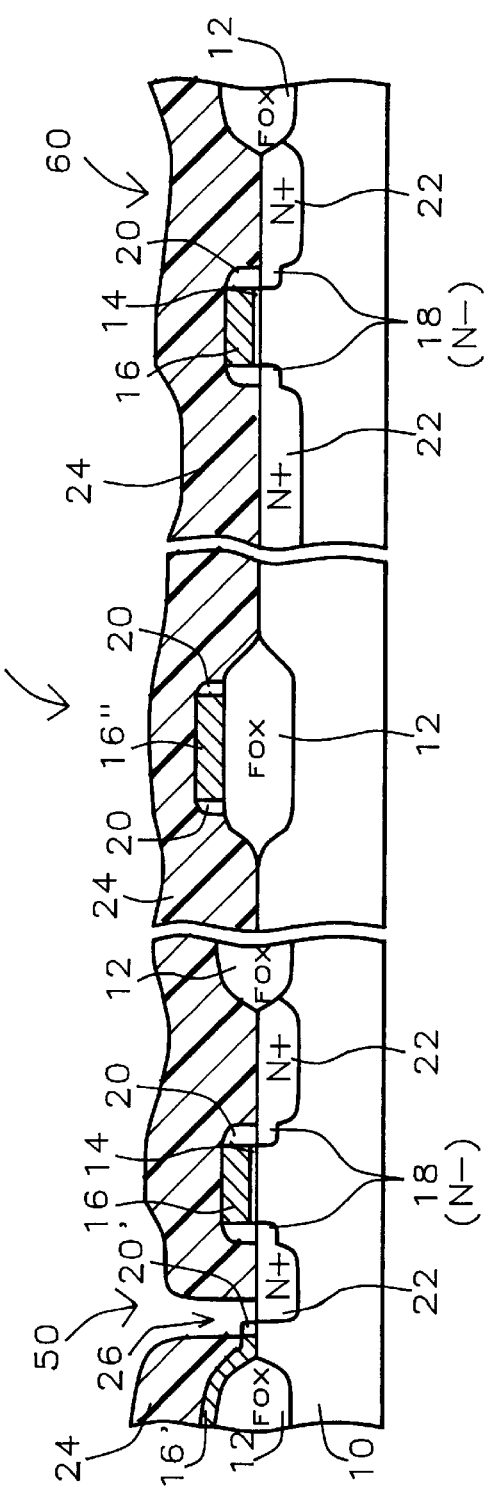
Figure 4:
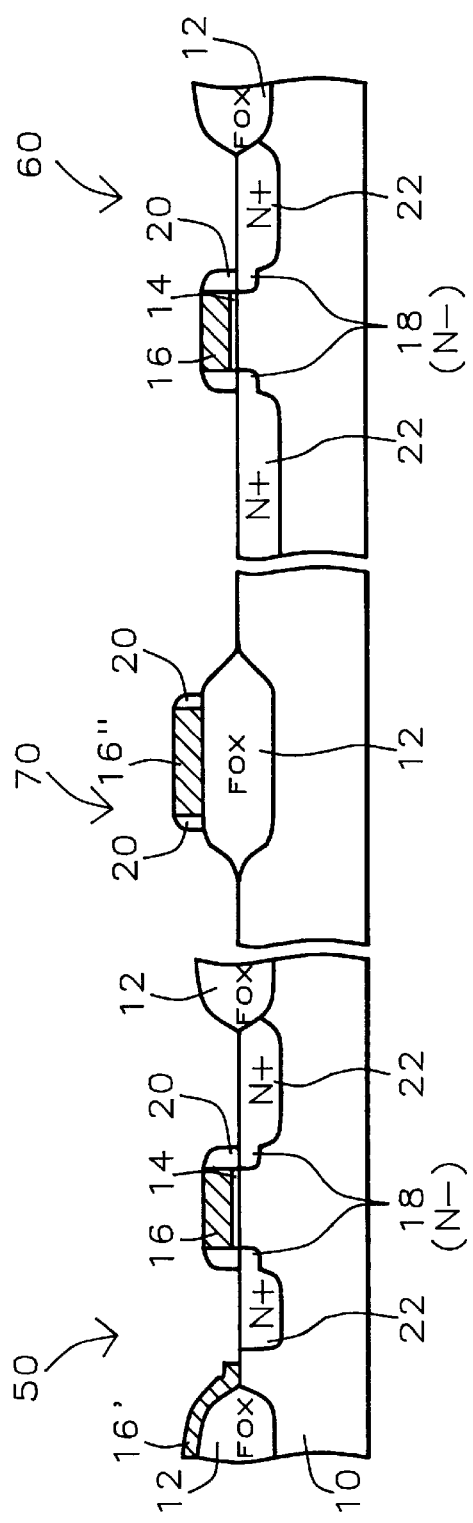

An important step in the inventive process is now described, with reference to FIGS. 3 and 4. In the prior art 4-transistor SRAM cell as shown in FIG. 1, local interconnections between gates and source/drain regions may be made using the gate layer polysilicon and buried contacts, in which the interconnecting polysilicon makes direct contact with the desired source or drain region. In the method of the invention, however, the need for a buried contact is eliminated by the use of a butted contact formed with silicide. A key feature is the removal of sidewall spacer 20'. A photoresist mask 24 is formed by conventional lithography and etching to expose only sidewall spacer 20', through opening 26. The spacer is removed by plasma etching using fluorine-based chemistry. The photoresist is then removed. Etching of spacer 20' will allow the silicide local interconnect to be formed to connect the poly 16' to source/drain 22, in steps to be described.

Figure 5:
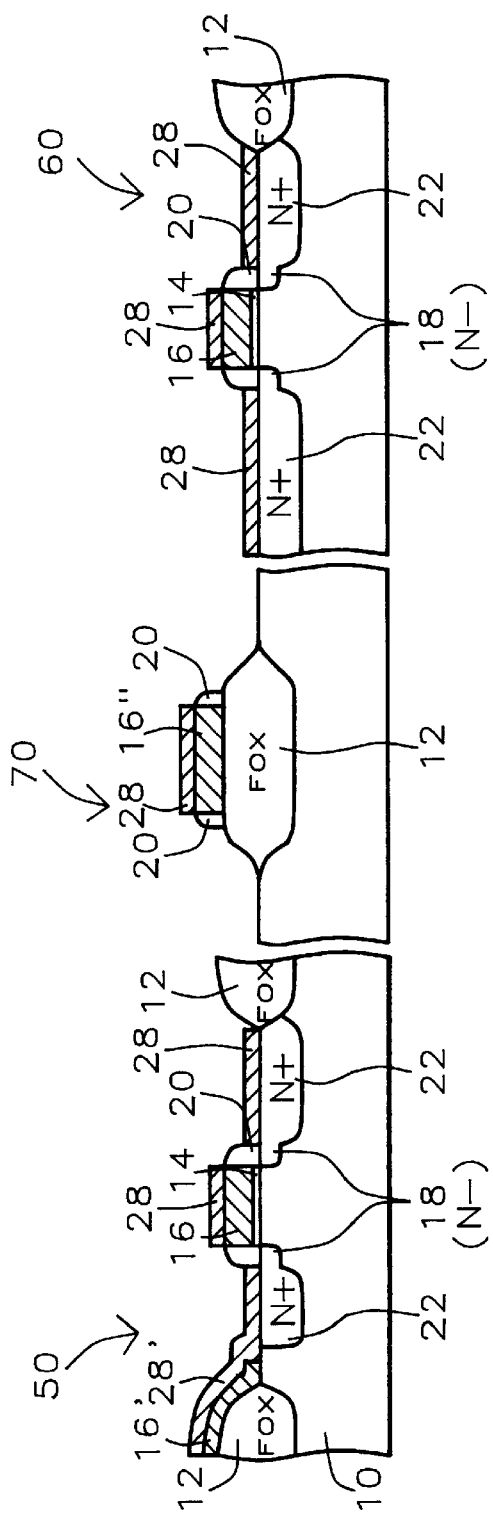

Referring now to FIG. 5, a salicide (self-aligned silicide) process is carried out, in all regions of the substrate, to form low sheet resistance contacts for the logic and simultaneously to form a silicide local interconnect in the SRAM, as well as a polycide capacitor bottom plate. Titanium is deposited over the entire substrate to a thickness of between about 200 and 700 Angstroms, by sputtering. A first rapid thermal anneal (RTA) is performed, to react the titanium with the polysilicon 16 and 16' and with the single-crystal silicon in the source/drain regions 22, resulting in titanium silicide ($TiSi_2$). The RTA is performed in an ambient of $N_2$ (nitrogen) or $NH_3$ (ammonia) for between about 20 and 60 seconds, at a temperature of between about 600° and 750° C. After the rapid thermal anneal, a layer of TiN (titanium nitride) covers the $TiSi_2$ over the silicon surfaces, and also directly on the $SiO_2$ surfaces, i.e., the spacers 20 and FOX regions 12. The TiN is stripped from all surfaces by etching with a solution $NH_4OH$ (ammonium hydroxide).

A second RTA is then performed in an ambient of $N_2$ or $NH_3$ for between about 25 and 60 seconds, at a temperature of between about 600° and 750° C., for the purpose of transforming the C49 suicide into C54 suicide. The resultant structure of FIG. 5 has a salicided contact structure with titanium silicide contacts for the source/drain regions, and a titanium silicide local interconnect 28' in the memory region 50. In addition, a polycide bottom plate is formed in the capacitor region.

Figure 6:
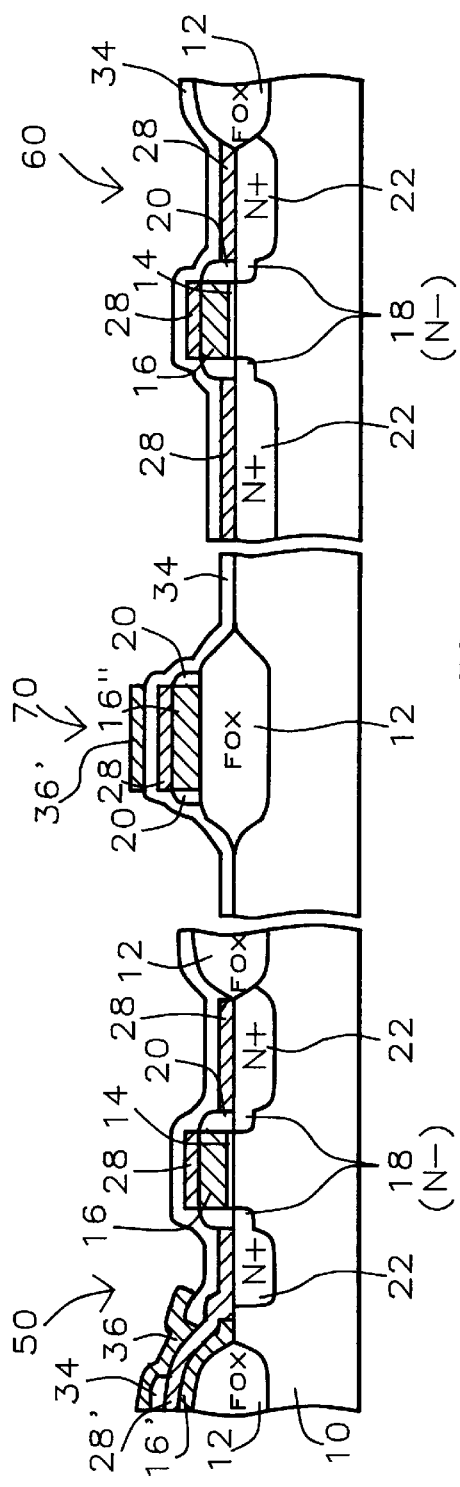
Figure 7:
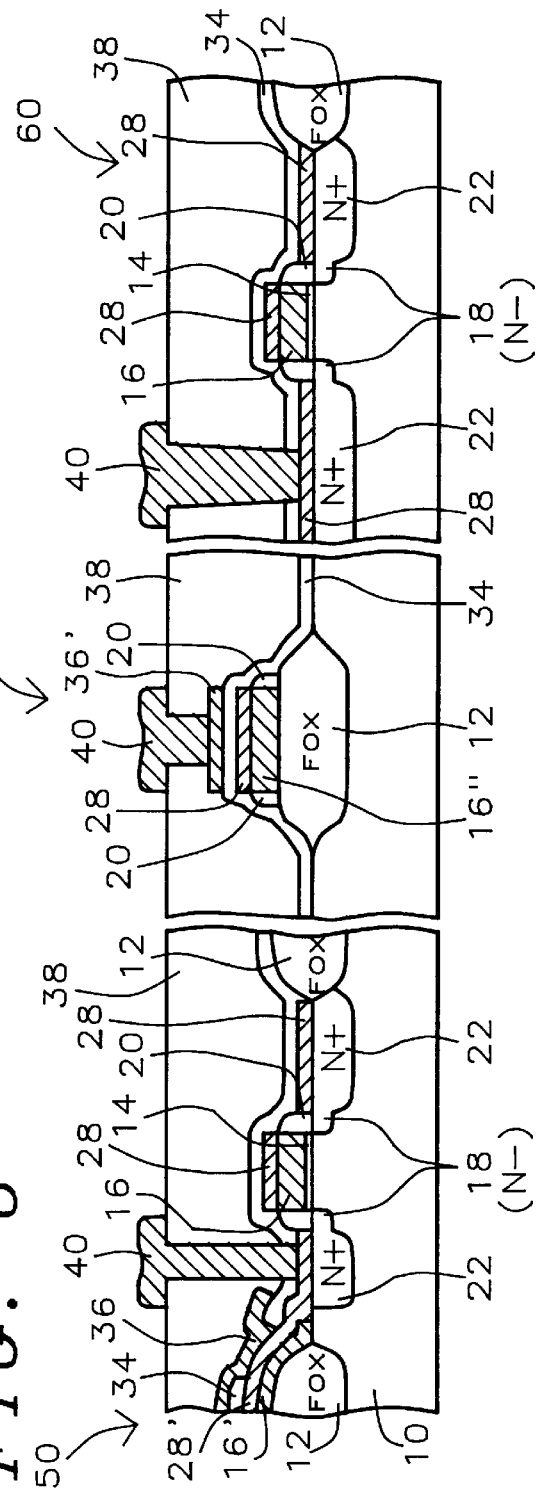

Completion of the logic and SRAM devices may now continue, and will be briefly described. With reference to FIGS. 6 and 7, an interpoly oxide (IPO) 34 is deposited and etched, and has a thickness of between about 1000 and 2500 Angstroms. This layer serves to isolate the first layer of polysilicon from a subsequent layer, and also serves as the dielectric for the mixed-mode capacitor. A second layer of polysilicon 36 is now deposited and patterned, and is used to form the high-resistance-value resistors of the 4-transistor SRAM (not shown), and the top plate 36' of the mixed-mode capacitor. This second poly layer also is used as the $V_{cc}$ interconnect (not shown) for the SRAM of the invention. A thick oxide 38, such as BPSG (borophosphosilicate glass), PSG or the like is deposited and patterned to provide an insulator for contacts to the polycide with metal interconnection layer 40.

The adantages of the invention include a very manufacturable process for making an IC with SRAM, mixed-mode capacitor and logic. In addition, the problem of substrate trench formation common to some buried contact processes does not occur, since only a single polysilicon is utilized to form the SRAM butted contact of the invention. Furthermore, an additional degree of freedom is gained for the second polysilicon of the invention over a buried contact process. That is, since the polysilicon is not required for making contact to the active region 22, it may be used for other purposes or design rules may be tightened. In addition, contact resistance is lowered through the use of a silicide at the poly-2 to poly-1 interface. And finally, a smaller SRAM cell size may be accomplished using the butted contact of the invention, as opposed to a buried contact that requires additional substrate area.

While the invention has been particularly shown and described with reference to the preferred embodiments thereof, it will be understood by those skilled in the art that various changes in form and details may be made without departing from the spirit and scope of the invention.

What is claimed is:

1. A method of forming an SRAM (Static Random Access Memory), a mixed-mode capacitor, and logic on a single semiconductor substrate, in a first memory region, a capacitor region, and a logic region, respectively, comprising the steps of:

providing a semiconductor substrate;

forming field isolation regions in said semiconductor substrate;

forming a gate oxide over said substrate between said field isolation regions;

depositing a first polysilicon layer over said gate oxide;

patterning said first polysilicon layer, comprising:
 forming gates over a portion of said gate oxide;
 forming polysilicon interconnects over a portion of said field isolation regions, only in said first memory region; and
 forming a bottom capacitor plate over a field oxide region in said capacitor region;

forming lightly doped drain (LDD) active regions in said substrate, adjacent to each said gate;

forming insulating spacers on the sidewalls of said gates, polysilicon interconnects and bottom capacitor plate;

completing formation of said active regions by a heavy ion implant;

removing said insulating spacers from the sidewalls of said polysilicon interconnects;

forming a layer of titanium silicide over said gates, polysilicon interconnects, bottom capacitor plate and active regions, whereby said titanium silicide electrically connects said polysilicon interconnects and said active regions in said first memory region;

forming an interpoly oxide over said semiconductor substrate;

forming an opening in said interpoly oxide over said polysilicon interconnect;

depositing a second layer of polysilicon over said substrate; and patterning said second layer of polysilicon to form a to form a top capacitor plate over said bottom capacitor plate, and to form a load resistor for said SRAM.

2. The method of claim 1 wherein said removing said insulating spacers from sidewalls of said polysilicon interconnects comprises the steps of:

forming a layer of photoresist material over said semiconductor substrate;

forming openings in said photoresist material to expose said insulating spacers;

removing said insulating spacers by plasma etching with fluorine-based chemistry; and removing said photoresist material.

3. The method of claim 1 wherein said forming a layer of titanium silicide comprises the steps of:

depositing a layer of titanium over said semiconductor substrate;

performing a first rapid thermal anneal whereby a layer of titanium silicide/titanium nitride is formed over said polysilicon interconnects, gate electrodes, bottom capacitor plate and active regions, and a layer of titanium nitride is formed over said insulating spacers;

removing all of said titanium nitride; and performing a second rapid thermal anneal.

4. The method of claim 3 wherein said titanium is deposited to a thickness of between about 200 and 700 Angstroms.

5. The method of claim 1 wherein said first rapid thermal anneal is performed at a temperature of between about 600° and 750° C., in an ambient gas selected from the group consisting of $N_2$ and $NH_3$, for between about 20 and 60 seconds.

6. The method of claim 1 wherein said second rapid thermal anneal is performed at a temperature of between about 600° and 750° C., in an ambient gas selected from the group consisting of $N_2$ and $NH_3$, for between about 20 and 60 seconds.

7. The method of claim 1 wherein said interpoly oxide is formed to a thickness of between about 1000 and 2500 Angstroms, by chemical vapor deposition.

8. The method of claim 1 wherein said second layer of polysilicon is formed to a thickness of between about 1000 and 2500 Angstroms.

9. The method of claim 1 wherein said polysilicon interconnects are connected to gate electrodes of other transistors in said SRAM.

10. A method of forming a local interconnect in an SRAM simultaneously with the formation of a salicide in logic devices on the same semiconductor substrate, wherein a mixed mode capacitor is also formed, comprising the steps of:

providing a semiconductor substrate having MOS (Metal Oxide Semiconductor) transistors formed therein, separated by field isolation regions, each said transistor comprising a gate overlying a gate oxide and having source and drain regions in said substrate, with spacers on the sidewalls of said gates, wherein some of said field oxide regions in said SRAM have polysilicon interconnects, with sidewall spacers, thereover, and wherein a bottom capacitor plate is formed over the field isolation region for said mixed mode capacitor;

removing said sidewall spacers from said polysilicon interconnects;

forming a first interpoly oxide over said bottom capacitor plate;

depositing a layer of titanium over said semiconductor substrate; and forming said salicide over said gates, said source and drain regions, and said polysilicon interconnects, and whereby said local interconnect is formed connecting said polysilicon interconnects to one of said source regions.

11. The method of claim 10 wherein said removing said insulating spacers from sidewalls of said polysilicon interconnects comprises the steps of:

forming a layer of photoresist material over said semiconductor substrate;

forming openings in said photoresist material to expose said insulating spacers;

removing said insulating spacers by plasma etching with a fluorine-based chemistry; and removing said photoresist material.

12. The method of claim 11 wherein said forming said salicide comprises the steps of:

performing a first rapid thermal anneal whereby a layer of titanium silicide/titanium nitride is formed over said polysilicon interconnects, gate electrodes, bottom capacitor plate and active regions, and a layer of titanium nitride is formed over said insulating spacers; removing all of said titanium nitride; and performing a second rapid thermal anneal.

13. The method of claim 10 wherein said titanium is deposited to a thickness of between about 200 and 700 Angstroms.

14. The method of claim 12 wherein said first rapid thermal anneal is performed at a temperature of between about 600° and 750° C., in an ambient gas selected from the group consisting of $N_2$ and $NH_3$, for between about 20 and 60 seconds.

15. The method of claim 12 wherein said second rapid thermal anneal is performed at a temperature of between about 600° and 750° C., in an ambient gas selected from the group consisting of $N_2$ and $NH_3$, for between about 20 and 60 seconds.

* * * * *